(12) United States Patent
Lee et al.

(10) Patent No.: US 7,151,703 B2
(45) Date of Patent: Dec. 19, 2006

(54) SEMICONDUCTOR MEMORY DEVICE INCLUDING GLOBAL IO LINE WITH LOW-AMPLITUDE DRIVING VOLTAGE SIGNAL APPLIED THERETO

(75) Inventors: Geun-il Lee, Yongin-si (KR); Yong-suk Joo, Icheon-si (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 163 days.

(21) Appl. No.: 10/980,663

(22) Filed: Nov. 3, 2004

(65) Prior Publication Data
US 2005/0226060 A1    Oct. 13, 2005

(30) Foreign Application Priority Data
Apr. 12, 2004    (KR) ...................... 10-2004-0025058

(51) Int. Cl.
*G11C 7/00* (2006.01)
(52) U.S. Cl. .............. 365/189.11; 365/227; 365/185.23
(58) Field of Classification Search ........... 365/189.11, 365/227, 185.23
See application file for complete search history.

(56) References Cited

U.S. PATENT DOCUMENTS

| | | | | |
|---|---|---|---|---|
| 5,267,197 A | * | 11/1993 | McClure | ................. 365/189.01 |
| 5,930,196 A | * | 7/1999 | Yim | ...................... 365/230.06 |
| 5,953,261 A | * | 9/1999 | Furutani et al. | ........ 365/189.05 |
| 6,424,015 B1 | | 7/2002 | Ishibashi et al. | |
| 6,462,998 B1 | * | 10/2002 | Proebsting | ................... 365/205 |
| 6,519,195 B1 | | 2/2003 | Kanno et al. | |

* cited by examiner

*Primary Examiner*—Tuan T. Nguyen
(74) *Attorney, Agent, or Firm*—Marshall, Gerstein & Borun LLP

(57) ABSTRACT

A semiconductor memory device including a global IO line with a low-amplitude driving voltage signal applied thereto. In the device, a first driver converts a data signal of a first voltage level from a memory cell to a second voltage level in response to a read control signal, and outputs it to a global IO line. A first level shifter converts the data signal of the second voltage level from the line back to the first voltage level, and outputs it to a data output terminal. A second driver converts an external data signal of a first voltage level from a data input terminal to a second voltage level, and outputs it to a global IO line. A second level shifter converts the external data signal of the second voltage level from the line back to the first voltage level and outputs it to a write driver.

17 Claims, 4 Drawing Sheets

SEMICONDUCTOR MEMORY DEVICE INCLUDING GLOBAL IO LINE WITH LOW-AMPLITUDE DRIVING VOLTAGE SIGNAL APPLIED THERETO

BACKGROUND OF THE INVENTION

1. Field of the Invention

The present invention relates to a semiconductor memory device including a global IO line with a low-amplitude driving voltage signal applied thereto, and more particularly to a semiconductor memory device including a global IO line with a low-amplitude driving voltage signal applied thereto, which reduces the amplitude of a driving voltage signal applied to the global IO line, thereby decreasing power consumption for data transmission and also overcoming problems occurring in a high speed operation due to the use of high-amplitude voltage signals, thereby allowing a high frequency operation.

2. Description of the Related Art

DRAM (Dynamic Random Access Memory) is a type of volatile memory including cells, each of which is composed of a transistor and a capacitor to store data. Data input/output operations as basic functions of a DRAM cell are carried out by turning on/off a word line serving as a gate input to a transistor in the DRAM cell.

FIG. 1 is a block diagram showing the internal configuration of a general DRAM device for inputting and outputting data. As shown in FIG. 1, a memory cell region in the general DRAM device is divided into a plurality of banks. Data stored in each cell is read by transferring the cell data amplified by an IO (Input/Output) sense amplifier to a DQ block via a global IO line. External input data is written to a memory cell by transferring the external data input through a DQ block to a write driver via a global IO line and then storing the transferred data in the memory cell.

As demand for high speed operation of the DRAM device increases, the need to stabilize the high speed operation of each element in the DRAM device even in high frequency environments increases, and, in particular, the need to decrease power consumption for reading and writing data via a global IO line and also to prevent a decrease in a timing margin during the high speed operation via the global IO line arises.

However, in the prior art, voltage signals of the same voltage level as an internal voltage Vint used as Vperi or Vdd are used to input and output data via the global IO lines. When data input/output operations are performed in the general DRAM input/output configuration, the use of high amplitude signals for data transmission via the global IO lines causes an increase in power consumption and ground bouncing. In addition, different lengths of transmission lines between banks and DQ blocks cause data input and output to and from the banks to have different flight times and also reduces the timing margin for latching data, thereby causing problems in the high speed operation.

SUMMARY OF THE INVENTION

Therefore, the present invention has been made in view of the above problems, and it is an object of the present invention to provide a semiconductor memory device including a global IO line with a low-amplitude driving voltage signal applied thereto, whereby when data is input and output via global IO lines, the voltage of signals transmitted via the global IO lines is appropriately controlled, thereby preventing not only an increase in power consumption and ground bouncing in the high speed operation but also a decrease in the timing margin in the high speed operation due to different lengths of transmission lines between banks and DQ blocks.

In accordance with one aspect of the present invention, the above and other objects can be accomplished by the provision of a semiconductor memory device including a global IO line with a low-amplitude driving voltage signal applied thereto, the device comprising a driver for converting a data signal, received from a memory cell after being amplified to a first voltage level by a sense amplifier, to a second voltage level in response to a read control signal and then outputting the data signal of the second voltage level to a global IO line; and a level shifter for converting the data signal of the second voltage level received via the global IO line to the first voltage level and then outputting the data signal of the first voltage level to a data output terminal.

Preferably, the second voltage level is lower than the first voltage level.

Preferably, the driver includes a pull-up means for bringing the global IO line to the second level in response to a control signal obtained by a logical operation between the read control signal and the data signal; and a pull-down means for bringing the global IO line to a ground voltage level in response to a control signal obtained by a logical operation between the read control signal and an inverted signal of the data signal.

Preferably, the driver further includes a delay unit for controlling data skew between the data signal and the inverted signal due to an increase and a decrease in respective signal levels of the data signal and the inverted signal.

Preferably, the level shifter includes a switching element for activating or deactivating the level shifter in response to the read control signal.

In accordance with another aspect of the present invention, there is provided a semiconductor memory device including a global IO line with a low-amplitude driving voltage signal applied thereto, the device comprising a driver for converting an external data signal of a first voltage level received from a data input terminal to a second voltage level and outputting the external data signal of the second voltage level to a global IO line; and a level shifter for converting the external data signal of the second voltage level received via the global IO line to the first voltage level and outputting the external data signal of the first voltage level to a write driver.

Preferably, the second voltage level is lower than the first voltage level.

Preferably, the driver includes a pull-up means for bringing the global IO line to the second level in response to a control signal obtained by a logical operation between the write control signal and the external data signal; and a pull-down means for bringing the global IO line to a ground voltage level in response to a control signal obtained by a logical operation between the write control signal and an inverted signal of the external data signal.

Preferably, the driver further includes a delay unit for controlling data skew between the external data signal and the inverted signal due to an increase and a decrease in respective signal levels of the external data signal and the inverted signal.

Preferably, the level shifter includes a switching element for activating or deactivating the level shifter in response to the write control signal.

In accordance with yet another aspect of the present invention, there is provided a semiconductor memory device including a global IO line with a low-amplitude driving voltage signal applied thereto, the device comprising a first driver for converting a cell data signal, received from a memory cell after being amplified to a first voltage level by a sense amplifier, to a second voltage level in response to a read control signal and then outputting the cell data signal of the second voltage level to a global IO line; a first level shifter for converting the cell data signal of the second voltage level received via the global IO line to the first voltage level and then outputting the cell data signal of the first voltage level to a data output terminal; a second driver for converting an external data signal of the first voltage level received from a data input terminal to the second voltage level and outputting the external data signal of the second voltage level to a global IO line; and a second level shifter for converting the external data signal of the second voltage level received via the global IO line to the first voltage level and outputting the external data signal of the first voltage level to a write driver.

Preferably, the second voltage level is lower than the first voltage level.

Preferably, the first driver includes a first pull-up means for bringing the global IO line to the second voltage level in response to a control signal obtained by a logical operation between the read control signal and the cell data signal; and a first pull-down means for bringing the global IO line to a ground voltage level in response to a control signal obtained by a logical operation between the read control signal and an inverted signal of the cell data signal, and the second driver includes a second pull-up means for bringing the global IO line to the second voltage level in response to a control signal obtained by a logical operation between the write control signal and the external data signal; and a second pull-down means for bringing the global IO line to the ground voltage level in response to a control signal obtained by a logical operation between the write control signal and an inverted signal of the external data signal.

Preferably, the first driver further includes a first delay unit for controlling data skew between the cell data signal and the inverted signal thereof due to an increase and a decrease in respective signal levels of the cell data signal and the inverted signal thereof, and the second driver further includes a second delay unit for controlling data skew between the external data signal and the inverted signal thereof due to an increase and a decrease in respective signal levels of the external data signal and the inverted signal thereof.

Preferably, the first level shifter includes a first switching element for activating or deactivating the first level shifter in response to the read control signal, and the second level shifter includes a second switching element for activating or deactivating the second level shifter in response to the write control signal.

Preferably, the second voltage level is lower than the first voltage level, and the first driver includes a first pull-up means for bringing the global IO line to the second voltage level in response to a control signal obtained by a logical operation between the read control signal and the cell data signal; a first pull-down means for bringing the global IO line to a ground voltage level in response to a control signal obtained by a logical operation between the read control signal and an inverted signal of the cell data signal; and a first delay unit for controlling data skew between the cell data signal and the inverted signal thereof due to an increase and a decrease in respective signal levels of the cell data signal and the inverted signal thereof, and in addition the first level shifter includes a first switching element for activating or deactivating the first level shifter in response to the read control signal.

Preferably, the second voltage level is lower than the first voltage level, and the second driver includes a second pull-up means for bringing the global IO line to the second voltage level in response to a control signal obtained by a logical operation between the write control signal and the external data signal; a second pull-down means for bringing the global IO line to a ground voltage level in response to a control signal obtained by a logical operation between the write control signal and an inverted signal of the external data signal; and a second delay unit for controlling data skew between the external data signal and the inverted signal thereof due to an increase and a decrease in respective signal levels of the external data signal and the inverted signal thereof, and in addition the second level shifter includes a second switching element for activating or deactivating the second level shifter in response to the write control signal.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Embodiments of the present invention will be described in detail with reference to the accompanying drawings. The embodiments are only for illustrating the present invention, without limiting the scope of the present invention.

Figure 1:
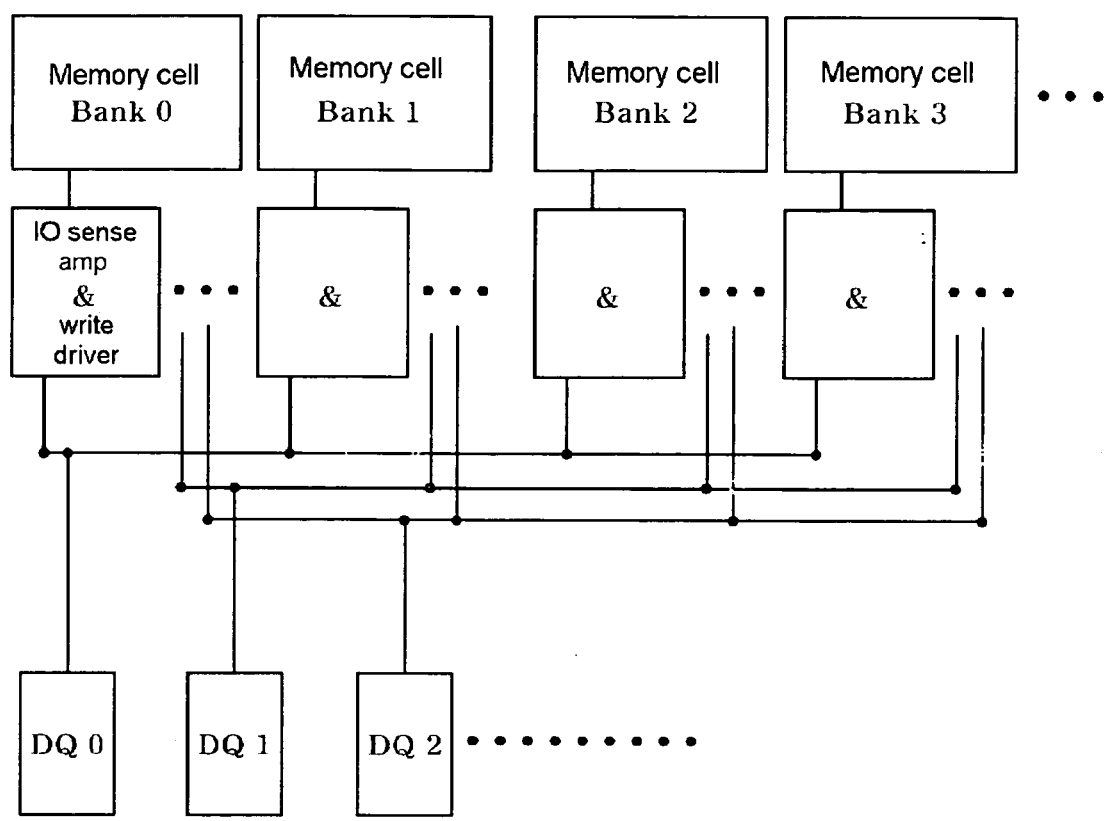
FIG. 1 is a block diagram showing the configuration of a conventional semiconductor memory device including a global IO line.
Figure 2:
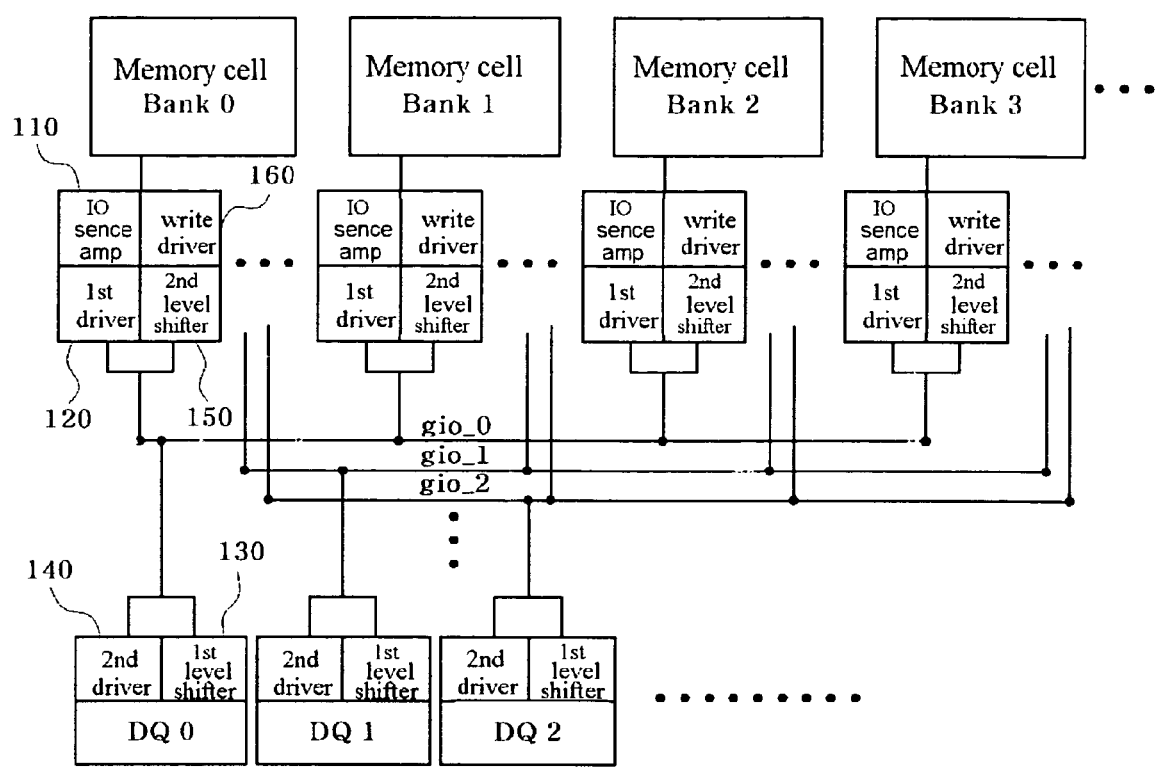
FIG. 2 is a schematic diagram illustrating the configuration of a semiconductor memory device including a global IO line with a low-amplitude driving voltage signal applied thereto according to an embodiment of the present invention.

FIG. 2 is a schematic diagram illustrating the configuration of a semiconductor memory device including a global IO line with a low-amplitude driving voltage signal applied thereto according to an embodiment of the present invention.

A shown in FIG. 2, a first embodiment of the semiconductor memory device according to the present invention includes a first driver 120, a first level shifter 130, a second driver 140 and a second level shifter 150. In response to a read control signal rd_ctrl, the first driver 120 converts a cell data signal received from a memory cell, which is amplified to a Vdd voltage level via an IO sense amplifier 110, to a Vglobal voltage level lower than the Vdd voltage level, and the first driver 120 then outputs the cell data signal of the Vglobal voltage to a global IO line gio_0, gio_1, . . . . The first level shifter 130 converts the cell data signal of the Vglobal voltage level received via the global IO line gio_0, gio_1, . . . back to the Vdd voltage level, and then outputs the cell data signal of the Vdd voltage level to a data IO terminal DQ0, DQ1, . . . . In response to a write control signal wt_ctrl, the second driver 140 converts an external data signal of the Vdd voltage level received from the data IO terminal DQ0, DQ1, . . . to the Vglobal voltage level, and then outputs the external data signal of the Vglobal voltage level to the global IO line gio_0, gio_1, . . . . The second level shifter 150 converts the external data signal of the Vglobal voltage level received via the global IO line gio_0, gio_1, . . . to the Vdd voltage level, and then outputs the external data signal of the Vdd voltage level to a write driver 160.

Figure 3A:
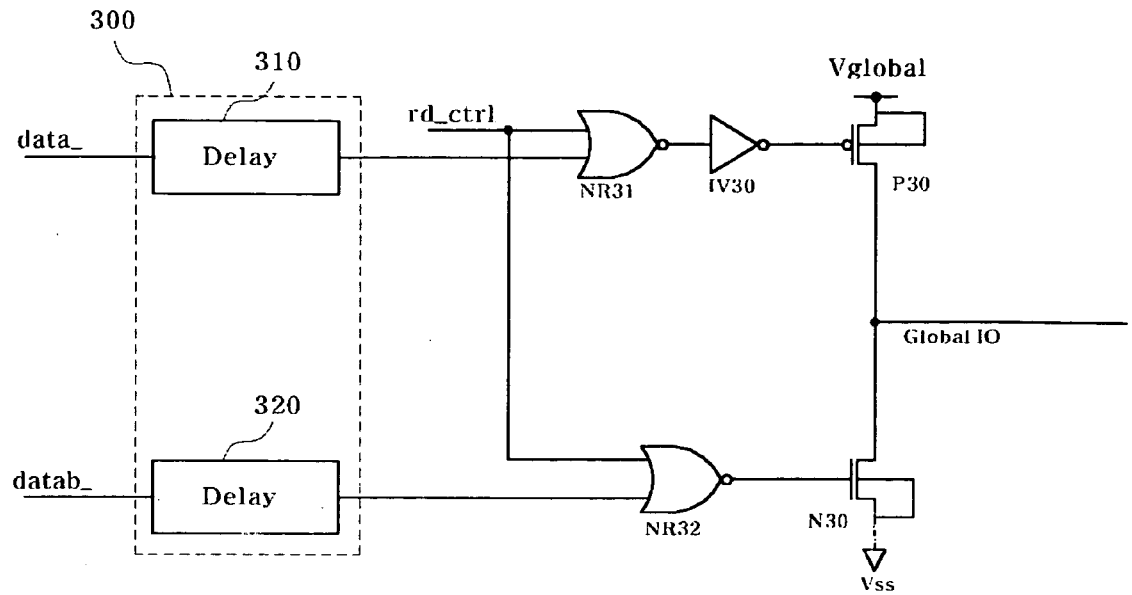
FIG. 3A is a circuit diagram showing the configuration of a first driver for converting a cell data signal of Vdd voltage level to Vglobal voltage level and transferring it to a global IO line.
Figure 3B:
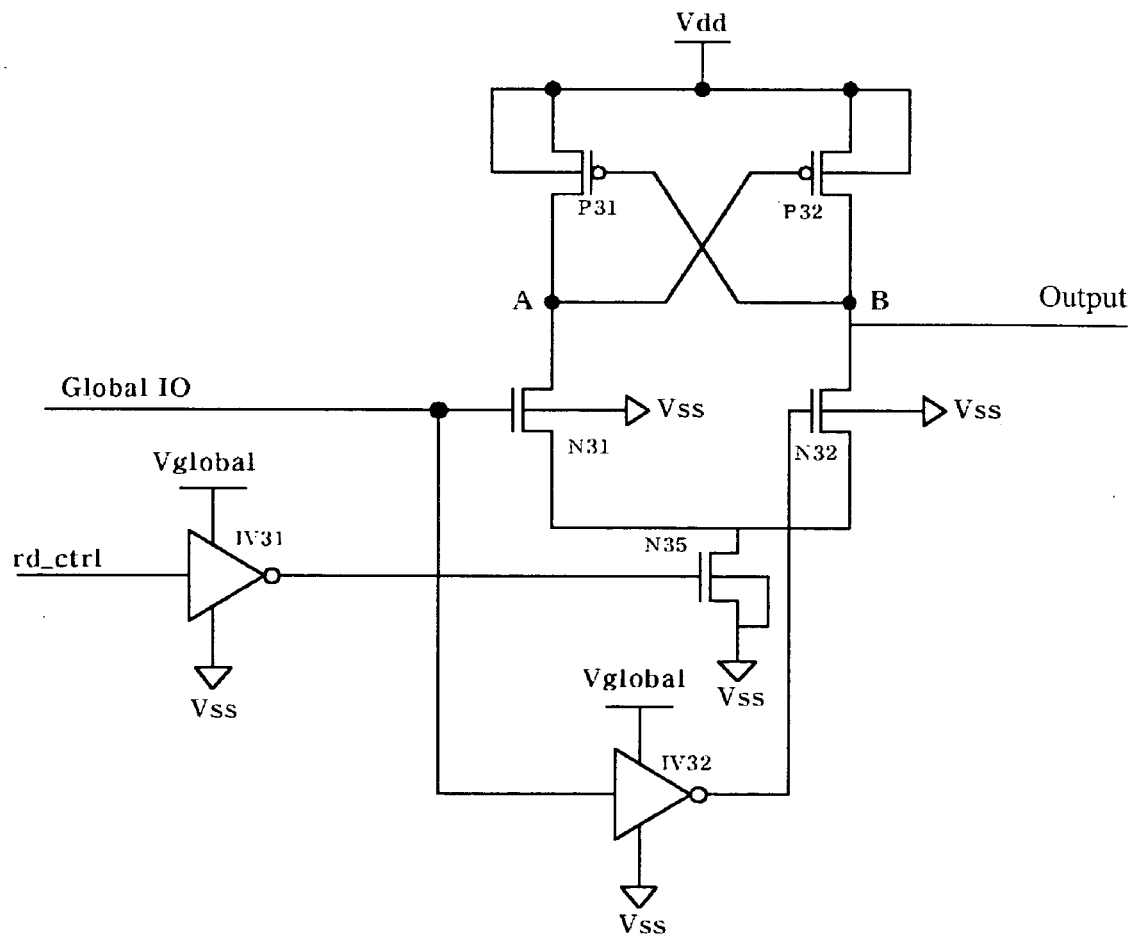
FIG. 3B is a circuit diagram showing the configuration of a first level shifter for converting the cell data signal of the Vglobal voltage level received via the global IO line back to the Vdd voltage level.
Figure 4A:
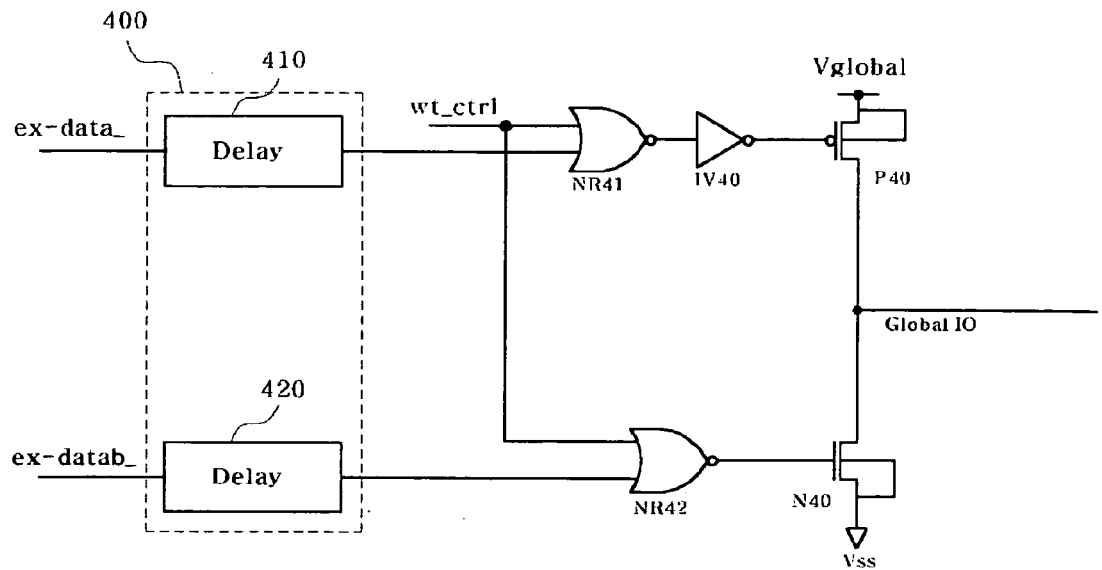
FIG. 4A is a circuit diagram showing the configuration of a second driver for converting an external data signal of the Vdd voltage level to the Vglobal voltage level and transferring it to a global IO line.
Figure 4B:
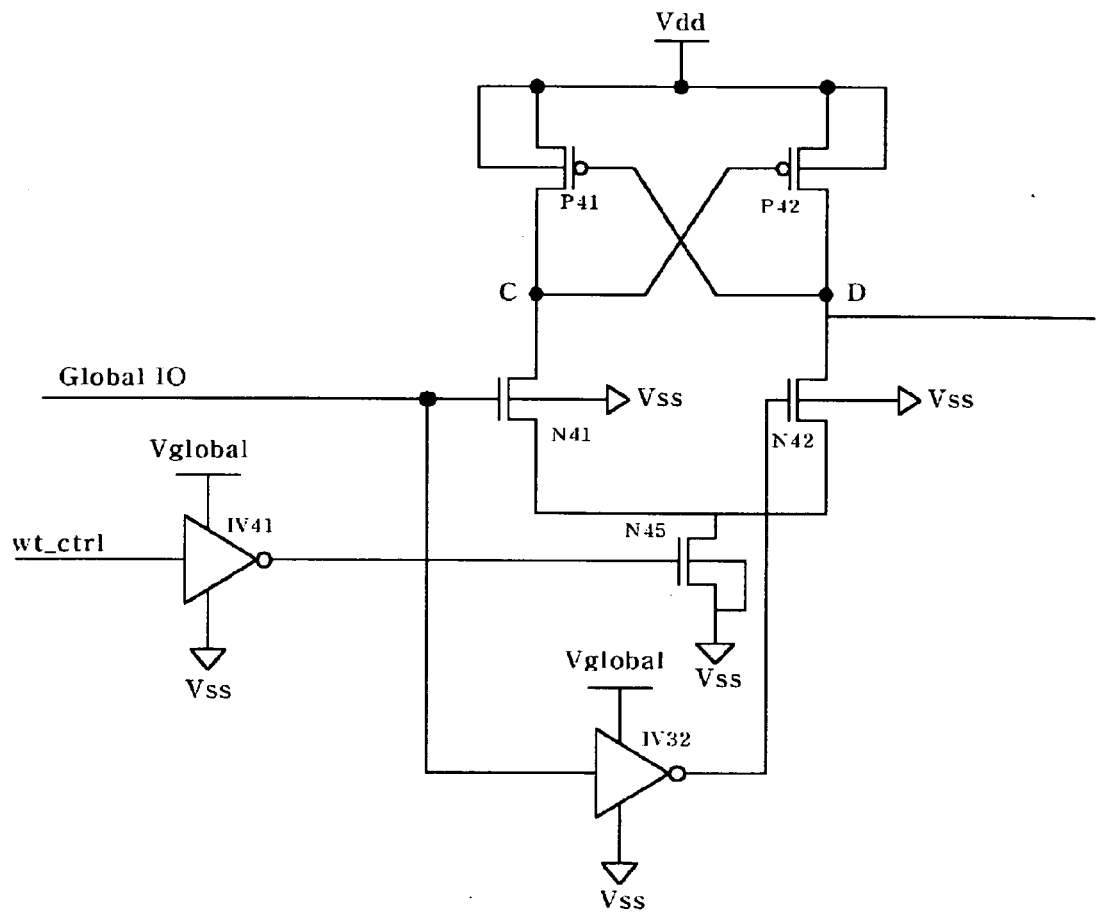
FIG. 4B is a circuit diagram showing the configuration of a second level shifter for converting the external data signal of the Vglobal voltage level received via the global IO line back to the Vdd voltage level.

FIGS. 3A and 4A are circuit diagrams showing the configuration of the first and second drivers that convert the cell and external data signals of the Vdd voltage level to the Vglobal voltage level and then transfer them to the global IO line, respectively. FIGS. 3B and 4B are circuit diagrams showing the configuration of the first and second level shifters that convert the signals of the Vglobal voltage level received via the global IO line back to the Vdd voltage level, respectively. The operation of the semiconductor memory device including the global IO line with a low-amplitude driving voltage signal applied thereto according to the present invention will now be described in detail with reference to FIGS. 2 to 4B.

We first describe a read operation of data stored in a cell. The entire memory cell region is divided into banks, and data stored in each cell is amplified to a data signal of the Vdd voltage level by the IO sense amplifier 110. In the present invention, the data signal of the Vdd voltage level is first transmitted to the first driver 120 for conversion into a signal of lower amplitude, instead of being transmitted directly to the global IO line gio_0, gio_1, . . . . The first driver 120 converts data signals of the Vdd voltage level into data signals of an appropriate voltage level, particularly, data signals of the Vglobal voltage level lower than the Vdd voltage level. FIG. 3A shows the circuitry of the first driver 120. The operation of the first driver 120 will now be described in detail with reference to FIG. 3A.

As shown in FIG. 3A, the first driver 120 receives data signals data_ and datab_, where "data_" denotes data stored in each cell and "datab_" denotes an inverted signal of the data signal data_. The read control signal rd_ctrl is a control signal indicating a read operation, which is input to a NOR gate NR31 and a NOR gate NR32 to control the operation of the first driver 120.

First, if the read control signal rd_ctrl is at a high level, the output of the NOR gate NR31 is constantly at a low level irrespective of the level of the signal data_, whereby a signal input to the gate of a PMOS P30 after passing through an inverter IV30 is at a high level, thereby turning off the PMOS P30. Similarly, the output of the NOR gate NR32 is also constantly at a low level irrespective of the level of the signal datab_, thereby turning off an NMOS N30. Consequently, in this case, the semiconductor memory device deactivates the read operation.

On the other hand, if the read control signal rd_ctrl is at a low level, a signal of the Vglobal or ground level is output to the global IO line, depending on the levels of the signals data_ and datab_. For example, if the signal data_ is at a low level and the signal datab_ is at a high level, the signal data_ is input at a low level to the gate of the PMOS P30 via the inverter IV30 after being input to the NOR gate NR31 via a first delay means 310, thereby turning on the PMOS P30. In this case, after being input to the NOR gate NR32 via a second delay means 320, the signal datab_ is input at a low level to the gate of the NMOS N30, thereby turning off the NMOS N30. Accordingly, the signal of the Vglobal voltage level is output to a global IO line "Global IO", and is then transmitted to the first level shifter 130 that will be described in detail later. On the contrary, if the signal data_ is at a high level and the signal datab_ is at a low level, the PMOS P30 is turned off and the NMOS N30 is turned on, whereby a signal of the ground voltage level is output to the global IO line "Global IO", and is then transmitted to the first level shifter 130 as described above. In this manner, a cell data signal of the Vdd voltage level is transmitted to the global IO line "Global IO" after being converted to the Vglobal voltage level lower than the Vdd voltage level via the first driver 120. A first delay unit 300 provided in the first driver 120 includes first and second delay means 310 and 320, which are used to delay the data signals data_ and datab_ by predetermined times, respectively, for controlling data skew between the signals data_ and datab_ due to an increase and a decrease in their signal levels.

The data signal of the Vglobal voltage level transmitted via the global IO line "Global IO" is then input to the first level shifter 130, whereby the data signal is converted back into a data signal of the Vdd voltage level. The operation of the first level shifter 130 will now be described in detail with reference to FIG. 3B.

First, when the memory device does not perform the read operation, the read control signal rd_ctrl is at a high level, which shifts to a low level after passing through an inverter IV31, thereby turning off an NMOS N35, so that the first level shifter 130 is deactivated.

On the contrary, when the memory device performs the read operation, the read control signal rd_ctrl is at a low level, thereby turning on the NMOS N35, so that the first level shifter 130 is activated. First, if the data signal received via the global IO line "Global IO" is at the Vglobal voltage level, the NMOS N31 is turned on and the NMOS N32 is turned off. Accordingly, the voltage of a node A is pulled down to a Vss voltage level, and a PMOS P32 receives a signal of the Vss voltage level and is thus turned on, thereby bringing the voltage of a node B to the Vdd level. Consequently, the first level shifter 130 outputs a signal of Vdd voltage level through its output terminal.

On the other hand, if the data signal received via the global IO line "Global IO" is at the Vss voltage level, the NMOS N31 is turned off and the NMOS N32 is turned on. Accordingly, the voltage of the node B is pulled down to the Vss voltage level, and the PMOS P31 receives a signal of the Vss voltage level and is thus turned on, thereby bringing the voltage of the node A to the Vdd level. The signal of the Vdd voltage level is input from the node A to the gate of a PMOS P32, thereby turning off the PMOS P32. Consequently, the pull-down operation of the NMOS N32 causes a signal of the Vss voltage level to be output to the output terminal of the first level shifter 130. In this manner, the first level shifter 130 converts a data signal of the Vglobal voltage level received via the global IO line "Global IO" to the Vdd voltage level, and outputs the data signal of the Vdd voltage level to a data output terminal.

In summary, the read operation of data stored in each cell is performed in the following manner. A data signal data_or datab_ amplified to the Vdd voltage level by the IO sense amplifier 110 is not transmitted directly to the global IO line gio_0, gio_1, . . . , but is instead transmitted to the global IO line "Global IO" after being converted to a lower voltage level (Vglobal) by the first driver 120. The data signal is then output through the output terminal after being converted back to the Vdd voltage level by the first level shifter 130.

We next describe a write operation of external data. External data of the Vdd voltage level input through data input terminals DQ0, DQ1, . . . is not transmitted directly to the global IO line gio_0, gio_1, . . . , but is instead transmitted to the second driver 140 for conversion into a signal of a voltage level lower than the Vdd voltage level. The second driver 140 converts data signals of the Vdd voltage level into data signals of a predetermined voltage level, particularly, data signals of the Vglobal voltage level lower than the Vdd voltage level.

FIG. 4A is a circuit diagram showing the configuration of the second driver 140. The second driver 140 operates in the same manner as the first driver 120 of FIG. 3A. That is, the second driver 140 receives an external data signal ex-data_ and an inverted signal ex-datab_ thereof. A write control signal wt_ctrl is a control signal indicating a write operation, which is input to a NOR gate NR41 and a NOR gate NR42 to control the operation of the second driver 140.

First, if the write control signal wt_ctrl is at a high level, a PMOS P40 and an NMOS N40 are turned off, so that the semiconductor memory device does not perform the write operation.

On the other hand, if the write control signal wt_ctrl is at a low level, a signal of Vglobal or ground voltage level is output to the global IO line, depending on the levels of the signals ex-data_ and ex-datab_. For example, if the signal ex-data_ is at a low level and the signal ex-datab_ is at a high level, the signal ex-data_ input to the NOR gate NR41 via a third delay means 410 turns on the PMOS P40 after passing through an inverter IV40, whereas the signal ex-datab_ input to the NOR gate NR42 via a fourth delay means 420 turns off the NMOS N40 since the signal ex-datab_ is input at a low level to the NMOS N40. Accordingly, a signal of the Vglobal voltage level is output to a global IO line "Global IO", and is then transmitted to the second level shifter 150 that will be described in detail later. On the contrary, if the signal ex-data_ is at a high level and the signal ex-datab_ is at a low level, the PMOS P40 is turned off and the NMOS N40 is turned on, whereby a signal of the ground voltage level is output to the global IO line "Global IO", and is then transmitted to the second level shifter 150. In this manner, an external data signal of the Vdd voltage level is transmitted to the global IO line "Global IO" after being converted into the Vglobal voltage level lower than the Vdd voltage level via the second driver 140. A second delay unit 400 provided in the second driver 140 includes third and fourth means 410 and 420, which are used to delay the external data signals ex-data_ and ex-datab_ by predetermined times, respectively, for controlling data skew between the signals ex-data_ and ex-datab_ due to an increase and a decrease in their signal levels.

The external data signal of the Vglobal voltage level transmitted via the global IO line "Global IO" is then input to the second level shifter 150, whereby the external data signal is converted back into a signal of the Vdd voltage level in the same operating principle as in the first level shifter 130. The operation of the second level shifter 150 will now be described in detail with reference to FIG. 4B.

First, when the memory device does not perform the write operation, the write control signal wt_ctrl is at a high level, thereby turning off an NMOS N45, so that the second level shifter 150 is deactivated.

On the contrary, when the memory device performs the write operation, the write control signal wt_ctrl is at a low level, thereby turning on the NMOS N45, so that the second level shifter 150 is activated. First, if the external data signal received via the global IO line "Global IO" is at the Vglobal voltage level, the second level shifter 150 outputs a signal of the Vdd voltage level through its output terminal in the same manner as in the first level shifter 130. On the other hand, if the external data signal is at the Vss voltage level, a signal of the Vss voltage level is output to the output terminal of the second level shifter 150. In this manner, the second level shifter 150 converts the external data signal of the Vglobal voltage level received via the global IO line "Global IO" to the Vdd voltage level, and outputs the external data signal of the Vdd voltage level to the write driver 160 of FIG. 2, so that it is recorded in each memory cell.

In summary, the write operation of external data is performed in the following manner. An external data signal of the Vdd voltage level is not transmitted directly to the global IO line gio_0, gio_1, . . . , but is instead transmitted to the global IO line "Global IO" after being converted to a lower voltage level (Vglobal) by the second driver 140. After being converted back to the Vdd voltage level by the second level shifter 150, the external data signal is then output to the write driver 160, so that the external data is recorded in each memory cell.

As described above, the semiconductor memory device according to the first embodiment of the present invention can reduce the amplitude of a driving voltage signal applied to a global IO line when the device operates to read cell data or write external data. The amplitude reduction decreases power consumption for data transmission and also prevents a decrease in the timing margin for latching data due to the difference in flight times between memory banks. In addition, the semiconductor memory device makes a high frequency operation possible even when the device operates at high speed and also achieves a stable chip operation even when the number of global IO lines is increased.

In addition to the first embodiment, the present invention provides a second embodiment of the semiconductor memory device including a global IO line with a low-amplitude driving voltage signal applied thereto in connection with a read operation. In this embodiment, the semiconductor memory device includes a first driver 120 and a first level shifter 130. In response to a read control signal rd_ctrl, the first driver 120 converts a data signal received from a memory cell, which is amplified to a Vdd voltage level via an IO sense amplifier 110, to a Vglobal voltage level lower than the Vdd voltage level, and then outputs the data signal of the Vglobal voltage to a global IO line gio_0, gio_1, . . . . The first level shifter 130 converts the data signal of the Vglobal voltage level received via the global IO line gio_0, gio_1, . . . back to the Vdd voltage level, and then outputs the data signal of the Vdd voltage level to a data IO terminal DQ0, DQ1, . . . . This semiconductor memory device performs a data read operation according to the same operating principle as described above in the first embodiment.

The present invention also provides a semiconductor memory device including a global IO line with a low-amplitude driving voltage signal applied thereto in connection with a write operation. This semiconductor memory device includes a second driver 140 and a second level shifter 150. In response to a write control signal wt_ctrl, the second driver 140 converts an external data signal of the Vdd voltage level received from the data IO terminal DQ1, DQ1, . . . to the Vglobal voltage level, and then outputs the external data signal of the Vglobal voltage level to the global IO line gio_1, gio_1, . . . . The second level shifter 150 converts the external data signal of the Vglobal voltage level received via the global IO line gio_0, gio_1, . . . back to the Vdd voltage level, and then outputs the external data signal of the Vdd voltage level to the write driver 160. This semiconductor memory device performs an external data write operation according to the same operating principle as described above in the first embodiment.

The present invention can be applied to all types of memory devices that perform data read and write operations via global IO lines.

As apparent from the above description, a semiconductor memory device according to the present invention has the following features and advantages. The amplitude of a driving voltage signal applied to a global IO line is reduced in the semiconductor memory device, thereby decreasing power consumption for data transmission and also preventing a decrease in the timing margin for latching data due to the difference in flight times between memory banks. In addition, the semiconductor memory device makes a high frequency operation possible even when the device operates at high speed and also achieves a stable chip operation even when the number of global IO lines is increased.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device including a global input/output line with a low-amplitude driving voltage signal applied thereto, the device comprising:
    a driver for driving a cell data having a first voltage level by a sense amplifier to a second voltage level and outputting the data to the global input/output line in response to a read control signal; and
    a level shifter for converting the data signal of the second voltage level transmitted through the global input/output line to the first voltage level and then outputting to a data output terminal.

2. The device according to claim 1, wherein the second voltage level is lower than the first voltage level.

3. The device according to claim 1, wherein the driver includes:
    a pull-up means for bringing the global IO line to the second level in response to a control signal obtained by a logical operation between the read control signal and the data signal; and
    a pull-down means for bringing the global IO line to a ground voltage level in response to a control signal obtained by a logical operation between the read control signal and an inverted signal of the data signal.

4. The device according to claim 3, wherein the driver further includes a delay unit for controlling data skew between the data signal and the inverted signal due to an increase and a decrease in respective signal levels of the data signal and the inverted signal.

5. The device according to claim 1, wherein the level shifter includes a switching element for activating or deactivating the level shifter in response to the read control signal.

6. A semiconductor memory device including the global IO line with a low-amplitude driving voltage signal applied thereto, the device comprising:
    a driver for converting an external data signal of a first voltage level received from a data input terminal to a second voltage level and outputting the external data signal of the second voltage level to a global IO line according to a write control signal; and
    a level shifter for converting the external data signal of the second voltage level received via the global IO line to the first voltage level and outputting the external data signal of the first voltage level to a write driver.

7. The device according to claim 6, wherein the second voltage level is lower than the first voltage level.

8. The device according to claim 6, wherein the driver includes:
    a pull-up means for bringing the global IO line to the second level in response to a control signal obtained by a logical operation between the write control signal and the external data signal; and
    a pull-down means for bringing the global IO line to a ground voltage level in response to a control signal obtained by a logical operation between the write control signal and an inverted signal of the external data signal.

9. The device according to claim 8, wherein the driver further includes a delay unit for controlling data skew between the external data signal and the inverted signal due to an increase and a decrease in respective signal levels of the external data signal and the inverted signal.

10. The device according to claim 6, wherein the level shifter includes a switching element for activating or deactivating the level shifter in response to the write control signal.

11. A semiconductor memory device including a global IO line with a low-amplitude driving voltage signal applied thereto, the device comprising:
    a first driver for converting a cell data signal, received from a memory cell after being amplified to a first voltage level by a sense amplifier, to a second voltage level in response to a read control signal and then outputting the cell data signal of the second voltage level to the global IO line;
    a first level shifter for converting the cell data signal of the second voltage level received via the global IO line to the first voltage level and then outputting the cell data signal of the first voltage level to a data output terminal;
    a second driver for converting an external data signal of the first voltage level received from a data input terminal to the second voltage level and outputting the external data signal of the second voltage level to the global IO line; and
    a second level shifter for converting the external data signal of the second voltage level received via the global IO line to the first voltage level and outputting the external data signal of the first voltage level to a write driver.

12. The device according to claim 11, wherein the second voltage level is lower than the first voltage level.

13. The device according to claim 11, wherein the first driver includes:
    a first pull-up means for bringing the global IO line to the second voltage level in response to a control signal obtained by a logical operation between the read control signal and the cell data signal; and
    a first pull-down means for bringing the global IO line to a ground voltage level in response to a control signal obtained by a logical operation between the read control signal and an inverted signal of the cell data signal, and wherein the second driver includes:

a second pull-up means for bringing the global IO line to the second voltage level in response to a control signal obtained by a logical operation between the write control signal and the external data signal; and a second pull-down means for bringing the global IO line to the ground voltage level in response to a control signal obtained by a logical operation between the write control signal and an inverted signal of the external data signal.

14. The device according to claim 13, wherein the first driver further includes a first delay unit for controlling data skew between the cell data signal and the inverted signal thereof due to an increase and a decrease in respective signal levels of the cell data signal and the inverted signal thereof, and wherein the second driver further includes a second delay unit for controlling data skew between the external data signal and the inverted signal thereof due to an increase and a decrease in respective signal levels of the external data signal and the inverted signal thereof.

15. The device according to claim 11, wherein the first level shifter includes a first switching element for activating or deactivating the first level shifter in response to the read control signal, and wherein the second level shifter includes a second switching element for activating or deactivating the second level shifter in response to the write control signal.

16. The device according to claim 11, wherein the second voltage level is lower than the first voltage level, wherein the first driver includes:

a first pull-up means for bringing the global IO line to the second voltage level in response to a control signal obtained by a logical operation between the read control signal and the cell data signal;

a first pull-down means for bringing the global IO line to a ground voltage level in response to a control signal obtained by a logical operation between the read control signal and an inverted signal of the cell data signal; and a first delay unit for controlling data skew between the cell data signal and the inverted signal thereof due to an increase and a decrease in respective signal levels of the cell data signal and the inverted signal thereof, and wherein the first level shifter includes a first switching element for activating or deactivating the first level shifter in response to the read control signal.

17. The device according to claim 11, wherein the second voltage level is lower than the first voltage level, wherein the second driver includes:

a second pull-up means for bringing the global IO line to the second voltage level in response to a control signal obtained by a logical operation between the write control signal and the external data signal;

a second pull-down means for bringing the global IO line to a ground voltage level in response to a control signal obtained by a logical operation between the write control signal and an inverted signal of the external data signal; and a second delay unit for controlling data skew between the external data signal and the inverted signal thereof due to an increase and a decrease in respective signal levels of the external data signal and the inverted signal thereof, and wherein the second level shifter includes a second switching element for activating or deactivating the second level shifter in response to the write control signal.

* * * * *